(12) United States Patent
Brummer et al.

(10) Patent No.: US 12,019,098 B2
(45) Date of Patent: Jun. 25, 2024

(54) PATTERN ACQUISITIONS IN EQUIVALENT TIME SAMPLING SYSTEMS

(71) Applicant: Tektronix, Inc., Beaverton, OR (US)

(72) Inventors: Noah Brummer, Portland, OR (US); Andy K. Lim, Tigard, OR (US); Jan P. Peeters Weem, Forest Grove, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/883,755

(22) Filed: May 26, 2020

(65) Prior Publication Data

US 2020/0386791 A1 Dec. 10, 2020

Related U.S. Application Data

(60) Provisional application No. 62/857,729, filed on Jun. 5, 2019.

(51) Int. Cl.
*G01R 13/34* (2006.01)
*G01R 13/02* (2006.01)
*H04L 27/233* (2006.01)

(52) U.S. Cl.
CPC ....... *G01R 13/345* (2013.01); *G01R 13/0272* (2013.01); *H04L 27/233* (2013.01)

(58) Field of Classification Search
CPC .............. G01R 13/345; G01R 13/0272; G01R 13/0209; G01R 13/0254; H04L 27/233
USPC .......................................................... 702/67
See application file for complete search history.

(56) References Cited

U.S. PATENT DOCUMENTS

| | | | | |
|---|---|---|---|---|
| 4,647,862 A | * | 3/1987 | Blair | H03K 3/023 702/66 |
| 6,275,257 B1 | * | 8/2001 | Tallman | H04N 17/00 324/115 |
| 2008/0159368 A1 | * | 7/2008 | Mende | G01R 13/0254 375/226 |
| 2011/0166813 A1 | * | 7/2011 | Kelly | G01R 13/0254 702/67 |
| 2012/0140809 A1 | * | 6/2012 | Krause | H04L 1/206 375/224 |
| 2018/0364282 A1 | * | 12/2018 | Zhang | G01R 13/0254 |

(Continued)

OTHER PUBLICATIONS

"Baud," found at: https://en.wikipedia.org/wiki/Baud, printed Feb. 9, 2023, 3 pages.

(Continued)

*Primary Examiner* — Michael P Nghiem
(74) *Attorney, Agent, or Firm* — Miller Nash LLP; Andrew J. Harrington (57) ABSTRACT

An equivalent-time sampling test and measurement instrument for acquiring a repeating pattern signal under test at or near a maximum sampling speed of the test and measurement instrument. The test and measurement instrument includes a first input configured to receive repeating pattern information about a signal under test, a second input configured to receive the signal under test, one or more processors configured to determine an optimized trigger holdoff period that is set based on a minimum trigger holdoff period of a test and measurement instrument, and an acquisition unit configured to acquire a portion of the signal under test every optimized trigger holdoff period.

12 Claims, 5 Drawing Sheets

(56) References Cited

U.S. PATENT DOCUMENTS

2019/0227103 A1* 7/2019 Murakami .............. G06F 1/022
2020/0386791 A1* 12/2020 Brummer ........... G01R 13/0272

OTHER PUBLICATIONS

"Pseudorandom Binary Sequence," found at: https://en.wikipedia.org/wiki/Pseudorandom_binary_sequence, printed Feb. 9, 2023, 4 pages.
"Symbol Rate," found at https://en.wikipedia.org/wiki/Symbol-rate, printed Feb. 9, 2023, 7 pages.
"Real-Time Versus Equivalent-Time Sampling," found at: http://www.tek.com/en/documents/application-note/real-time-versus-equivalent-time-sampling, printed Feb. 8, 2023, 18 pages.

* cited by examiner

PATTERN ACQUISITIONS IN EQUIVALENT TIME SAMPLING SYSTEMS

PRIORITY

This disclosure claims benefit of U.S. Provisional Application No. 62/857,729, titled "PATTERN ACQUISITION IN AN EQUIVALENT TIME SAMPLING SYSTEM," filed on Jun. 5, 2019, which is incorporated herein by reference in its entirety.

TECHNICAL FIELD

This disclosure is directed to systems and methods related to test and measurement systems, and more particularly to pattern acquisition of a signal under test in an equivalent-time sampling test and measurement system.

BACKGROUND

Traditional equivalent-time sampling oscilloscopes offer a variety of methods for testing repeating patterns from a user that require digital signal processing (DSP). For the best jitter performance, and to reconstruct a coherent time-domain waveform, traditional equivalent-time sampling oscilloscopes acquire these types of waveforms in a pattern-synchronous clock-triggered mode. Long pattern lengths and slow pre-scaled clocks can reduce the equivalent-time sampling rate of the equivalent-time sampling oscilloscopes.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is an equivalent-time sampling test and measurement instrument which can retain the test and measurement instrument's maximum sampling rate while acquiring signals in a pattern-synchronous mode, regardless of the length of the pattern or the symbol rate of the pattern to be acquired. This can provide the fastest possible waveform throughput, thereby shortening the time to when further or offline processing of the acquired data can begin, which ultimately reduces the overall test-time for a user for whom test throughput is a key metric.

Traditional equivalent-time sampling oscilloscopes may digitize an incoming analog signal by strobing a high-speed sampling diode with a sequenced strobe or trigger signal. Generally, these sampler strobe events are synchronized to a user's pattern by a user-provided, pattern synchronous clock. Using traditional equivalent-time sampling oscilloscopes, a user-provided, pattern synchronous clock must be divided down if it is above the bandwidth of the trigger circuitry in the oscilloscope timebase, so the trigger clock of the test and measurement instrument is typically much slower than the pattern symbol rate. A counter in the test and measurement instrument counts down the number of symbols in the repetitive pattern, issuing a single strobe event with each repetition. However, combinations of long pattern lengths and slow pre-scaled clocks reduce the equivalent-time sampling rate of these test and measurement instruments.

User patterns are often a pseudo-random binary sequence (PRBS). For example, a user pattern may be a 26 GHz, or 26 Gbaud (symbol rate), PRBS16, which has pattern length of 65,535 symbols ($2^{16}-1$). To acquire this signal under test, a traditional test and measurement instrument must use a sub-rate clock to trigger as its trigger circuitry bandwidth is much lower than 26 GHz. The test and measurement instrument may have a minimum trigger holdoff of 3.3 microseconds, which means that a trigger signal can be generated at most every 3.3 microseconds at a maximum sampling rate. The total time until 65,535 periods of the sub-rate trigger clock occur will be 40.3 microseconds, which is an increase of eight times the test and measurement instrument's minimum holdoff time, or a reduction in sample rate of eight times. During this 40.3 microsecond period, the pattern will have repeated a number of times. In the case of some test and measurement instruments, the pattern may repeat, for example, 16 times between strobe events when using a timebase that is triggered by a divided-by-16 clock. To acquire samples at a test and measurement instrument's maximum sample rate, a method of generating more than a single strobe event in this 40.3 microsecond period is required, as will be discussed in more detail below.

Some other methods of increasing the sample rate for patterns have been proposed, such as Multiple Strobes Per Pattern (MSPP). While these methods greatly improve the achievable sample rate of a test and measurement instrument in a pattern-synchronous mode by choosing a constant number of strobes to issue in each sub-rate pattern repetition, they still fall short of the maximum sampling rate. MSPP guarantees a uniform sampling of the pattern while also avoiding any "overlapping" of individual sample instances by choosing a number of strobe events per pattern repetition which is coprime with the ratio by which the pattern clock is divided for the sampling test and measurement instrument timebase. Because of the dependence on this coprime ratio, the time between strobe events can often be longer than the minimum system holdoff time, resulting in a slower-than-maximum sample rate.

Figure 1:
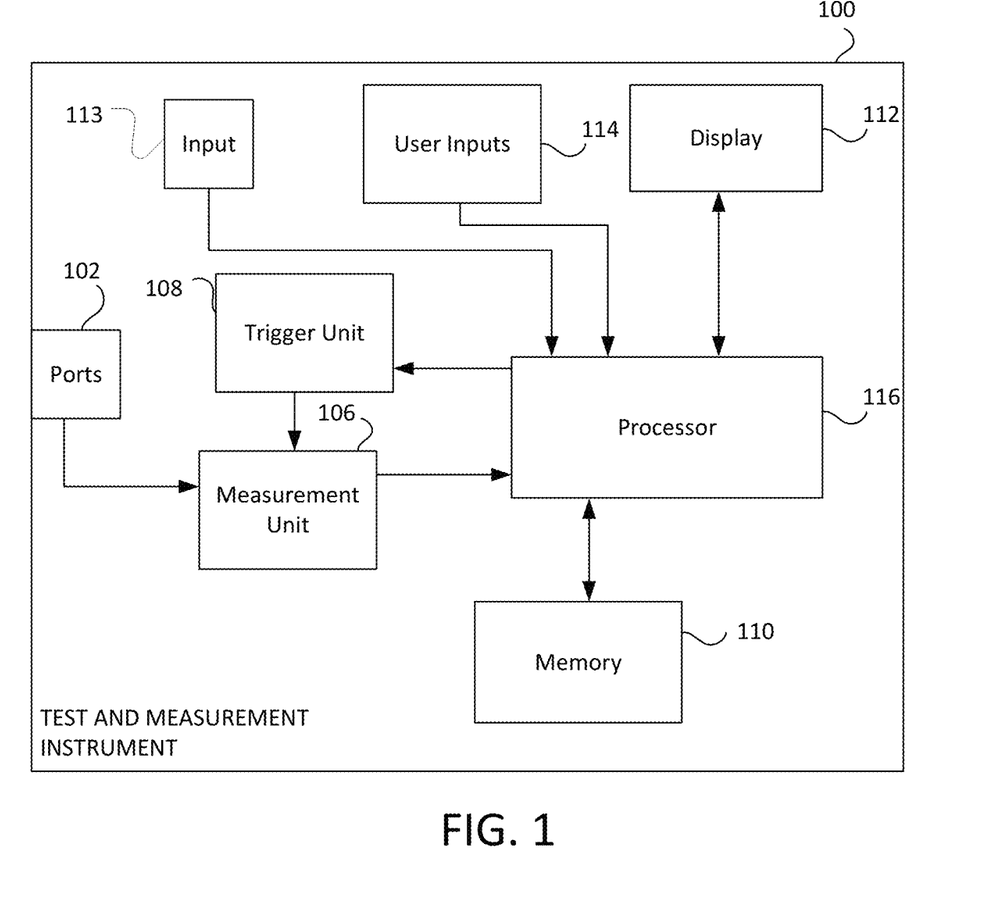
FIG. 1 is a block diagram of an example test and measurement instrument according to embodiments of the disclosure.

FIG. 1 is a block diagram of an example equivalent-time sampling test and measurement instrument 100, such as an oscilloscope, for implementing embodiments of the disclosure disclosed herein. The test and measurement instrument 100 can include a plurality of ports 102 which may be any electrical signaling medium. Ports 102 may include receivers, transmitters, and/or transceivers. Each port 102 is a channel of the test and measurement instrument 100.

The ports 102 can also be connected to a measurement unit 106 in the test and measurement instrument 100. Such a measurement unit 106 can include any component capable of measuring aspects (e.g., voltage, amperage, amplitude, etc.) of a signal received via ports 102. The test and measurement instrument 100 may include additional hardware and/or processors, such as conditioning circuits, an analog-to-digital converter, and/or other circuitry to convert a received signal to a waveform for further analysis. The resulting waveform can then be stored in a memory 110, as well as displayed on a display 112.

The test and measurement instrument 100 can also include a trigger unit 108 and one or more processors 116 to process the signals and/or waveforms received at the ports 102 from one or more devices under test. Although only one processor 116 is shown in FIG. 1 for ease of illustration, as will be understood by one skilled in the art, multiple processors 116 of varying types may be used in combination, rather than a single processor 116. The one or more processors 116 and/or trigger unit 108 can generate a trigger signal which causes the measurement unit 106 to obtain a measurement of a signal under test at the one or more ports 102. The measurement unit 106 can take a measurement of a portion of the signal under test each time a trigger signal is generated. The test and measurement instrument 100, however, includes a minimum period of time to reset various circuits and other hardware in the test and measurement instrument 100 prior to the next trigger signal. This is referred to as the minimum trigger holdoff.

The one or more processors 116 may be configured to execute instructions from memory 110 and may perform any methods and/or associated steps indicated by such instructions, such as acquiring repeating patterns using either optimized pattern acquisition or an optimized single strobe partial pattern acquisition, as discussed in more detail below. Memory 110 may be implemented as processor cache, random access memory (RAM), read only memory (ROM), solid state memory, hard disk drive(s), or any other memory type. Memory 110 acts as a medium for storing data, computer program products, and other instructions.

User inputs 114 are coupled to the one or more processors 116. User inputs 114 may include a keyboard, mouse, trackball, touchscreen, and/or any other controls employable by a user to interact with a graphical user interface (GUI) on the display 112. The display 112 may be a digital screen, a cathode ray tube based display, or any other monitor to display waveforms, measurements, and other data to a user. While the components of test and measurement instrument 100 are depicted as being integrated within test and measurement instrument 100, it will be appreciated by a person of ordinary skill in the art that any of these components can be external to test and measurement instrument 100 and can be coupled to test and measurement instrument 100 in any conventional manner (e.g., wired and/or wireless communication media and/or mechanisms). For example, in some embodiments, the display 112 may be remote from the test and measurement instrument 100.

Embodiments of the disclosure can receive a signal under test and, in a non-sequential manner, acquire the repeating pattern of the signal under test using the maximum sampling rate (i.e. minimum sampling period), or near to the maximum sampling rate (i.e. minimum sampling period), of the test and measurement instrument 100. As explained in more detail below, this is done by setting a trigger holdoff value at or near the minimum trigger holdoff value, such that samples may be taken at or near the maximum sampling rate of the test and measurement instrument 100. To do this, initially, the one or more processors 116 must obtain information about an incoming repeating pattern, including:

(1) Pattern length ($L_{pattern}$);
(2) Symbol Rate (R);
(3) Waveform record length in units of samples ($L_{record}$);
(4) Waveform duration in units of seconds (T); and
(5) Pattern clock (subrate of the symbol rate) (Pck).

This information may be obtained in a number of ways. In some embodiments, this information may be obtained through the user inputs 114. In other embodiments, the information may be obtained through some other electrical communication link, such as from a connected user device through wired or wireless means shown as input 113, as an example. The one or more processors 116 and/or the memory 110 may receive and/or store this information for use when obtaining the signal under test. The test and measurement instrument 100 also has a known minimum trigger holdoff value, H, which is the minimum amount of time required between each trigger signal.

Using this information, a time between samples, $t_s$, can be determined by dividing the waveform duration in units of seconds, T, by the waveform record length in units of samples. To maintain the maximum sample rate of the test and measurement instrument 100, an optimized pattern acquisition (OPA) trigger holdoff value, $H_{opt}$, can be chosen that is the smallest integer multiple N of the time between samples, $t_s$, such that:

$$N \cdot t_s = H_{opt} \geq H \quad (1)$$

The integer multiple N represents the number of sample indices that could occur between subsequent strobe events. An index, i, of an individual sample in the waveform is set such that ($i \in [0, 1, \ldots, L_{record}-1]$).

When acquiring samples using $H_{opt}$, samples acquired will have the following indices associated with them from a modulo operation:

$$[i_k]_{k=0}^{L_{record}-1} = [k \cdot N \bmod L_{record}] \quad (2)$$

If the integer multiple N and $L_{record}$ share a greatest common divisor that is larger than 1, then the sequence in equation (2) will start to repeat before the pattern has been uniformly sampled. If not corrected for, this repetition will cause the waveform to be inaccurately sampled. To address this issue, the one or more processors 116 account for this by anticipating which index would see a repeated sample before the record is complete and bumping—that is, incrementing or changing—the index when necessary to maintain only one sample per index per record.

To determine the number of times and location in the set of indices that these bumps may be necessary, the one or more processors 116 can determine the greatest common divisor of N and $L_{record}$. However, to save on the number of calculations needing to be done by the one or more processors 116, the fact that the first index that might need to be bumped will always by i=0 is used instead. By only checking against this first index, there is no need for the one or more processors 116 to pre-calculate the index locations of the necessary bumps, and checking can be done on the fly in real-time. After the index has been bumped from i=0 to i=1, then the next index that might need to be bumped will be i=1. The one or more processors 116 continue with this until $L_{record}$ indices have been sequenced, at which point the acquisition record will be complete. Offline or further online processing of the acquired data can then be completed.

Figure 2:
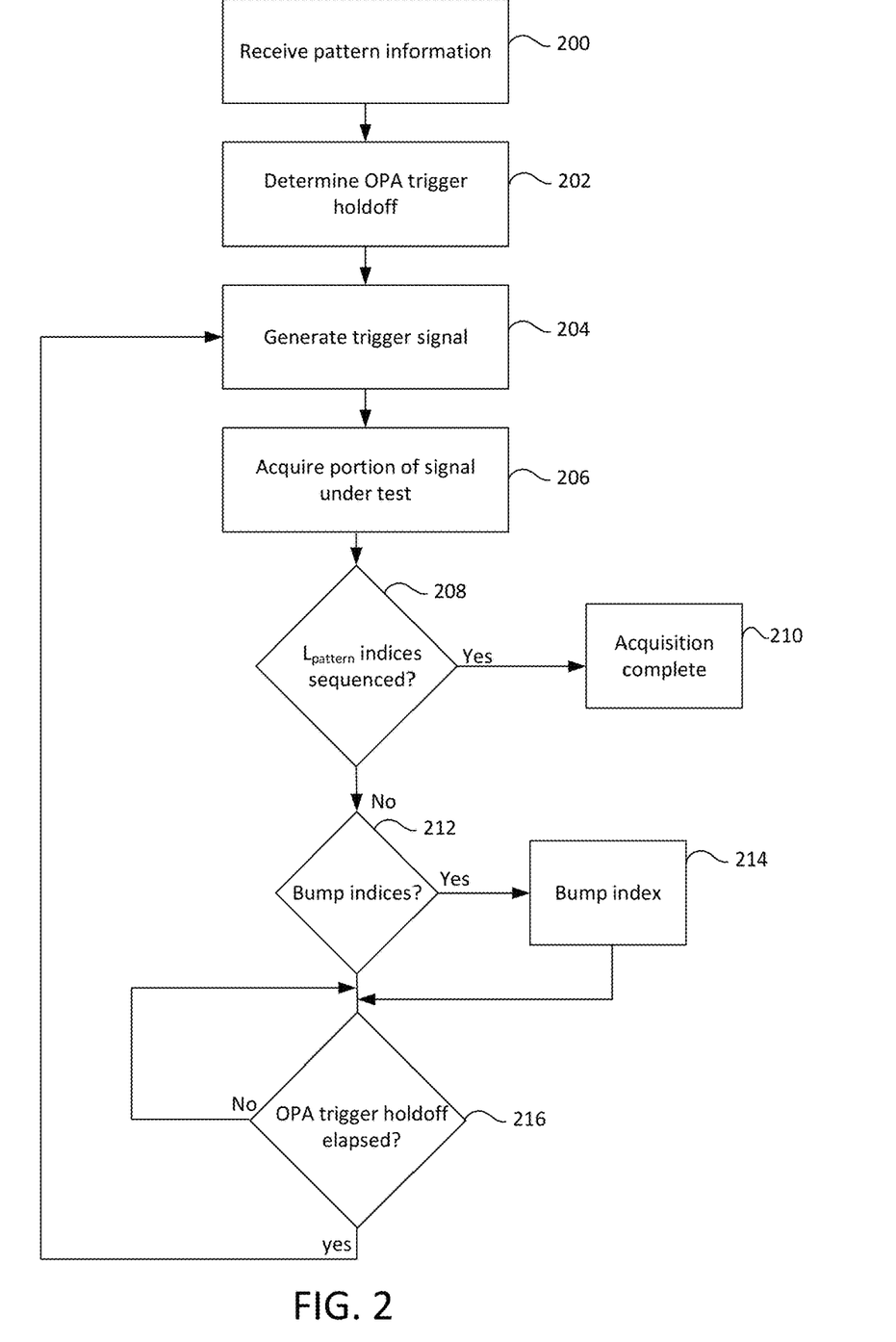
FIG. 2 is a flow chart for performing full pattern acquisition of a signal under test according to some embodiments of the disclosure.

FIG. 2 illustrates a flow chart for performing full pattern acquisition of a signal under test according to embodiments of the disclosure. Initially, in operation 200, information is received about a signal under test, as discussed above, including pattern length, symbol rate, etc.

In operation 202, an OPA trigger holdoff value is determined, as discussed in detail above. That is, the OPA trigger holdoff value is set to be equal to the time between samples, $t_s$, times the smallest integer multiple that results in the OPA trigger holdoff value being equal to or greater than the minimum trigger holdoff, H, of the test and measurement instrument 100.

In operation 204, when the OPA trigger holdoff value has been determined, acquisition of the signal under test can begin with a trigger signal generated by the one or more processors 116. In operation 206, a portion of the signal under test is acquired in response to the trigger signal. Then, in operation 208, it is determined whether pattern acquisition is completed. If yes, then in operation 210, the one or more processors 116 can output that the acquisition is complete. If no, then in operation 212, the one or more processors can determine whether the index needs to be bumped to prevent re-acquiring a portion of the waveform that has already been acquired. If the index needs to be bumped, then in operation 214, the index is bumped.

If the index does not need to be bumped and/or the index has already been bumped, in operation 216 the one or more processors 116 can determine whether the OPA trigger holdoff time period has occurred. If no, then the one or more processors 116 continue to wait until the OPA trigger holdoff time period is elapsed. If the time period has elapsed, the flow returns to operation 204 and a new trigger signal is generated.

Sometimes, however, a full pattern of a signal under test does not need to be acquired. Some embodiments of the disclosure include an optimized single strobe (OSS) partial pattern acquisition. The OSS partial pattern acquisition provides an optimum sample rate for a single strobe partial pattern acquisition in a pattern-synchronous mode. During OSS partial pattern acquisition, which may be referred to herein as OSS, the time to acquire the data scales linearly with a number of samples to be acquired. This can provide the fastest possible waveform throughput for situations where a user is interested in acquiring only a portion of a full pattern, which shortens the time to acquire the data of interest and can reduce the overall test-time.

Conventional test and measurement instruments can include single strobe acquisitions, however, these acquisitions are fundamentally different from embodiments of the disclosure including OSS in that the pattern synchronization of the conventional test and measurement instrument is achieved by counting the sub-rate of a user's symbol clock by timebase hardware in the conventional test and measurement instrument.

The hardware of the conventional test and measurement instrument implements a counter which uses the number of symbols in the repeating pattern as its terminus. This limits the sampling to occurring only once per pattern period times a prescaler factor.

Embodiments of the disclosure, in contrast, program a next sample point using a trigger holdoff period that equals the minimum integer multiples of the pattern period that is larger than the minimum trigger holdoff period. As an example, consider the 26 GHz PRBS16 signal with pattern length of 65,535 symbols and a minimum trigger holdoff in the test and measurement instrument of 3.3 microseconds, as discussed above. On a conventional test and measurement instrument, a prescaler factor needs to be 16 to slow down the clock to below the bandwidth of the trigger circuitry in the oscilloscope timebase. The sample-to-sample interval is then 65535*(1/26 GHz)*16=40 microseconds between each acquisition. Using embodiments of the disclosure, as will be discussed in more detail below, a minimum integer multiple of pattern period (65535*(1/26 GHz)=2.52 microseconds) that is larger than the minimum holdoff of 3.3 microseconds is 2. Therefore, the sample to sample interval is 65535*(1/26 GHz)*2=5.04 uS. In this case, embodiments of the disclosure are faster by a factor of 8 than conventional test and measurement instruments.

OSS, as described herein, allows a user the ability to reduce various measurement times greatly by increasing the acquisition update rate, as not all measurements require full pattern acquisition.

OSS can be performed using the following information about a repeating pattern, horizontal settings, and hardware limitations:

(1) Pattern length in units of symbols ($L_{pattern}$);
(2) Symbol rate in units of hertz ($f_{symbol}$);
(3) Samples per pattern in units of samples ($L_{samplesperpattern}$);
(4) Record length in units of samples ($L_{record}$); and
(5) Minimum trigger holdoff (H).

As mentioned above, the minimum trigger holdoff, H, is the known minimum sampling period the test and measurement instrument 100 can support.

The one or more processors 116 can compute the OSS trigger holdoff, $H_{OSS}$, as will be discussed further based on the minimum trigger holdoff, H.

Figure 3:
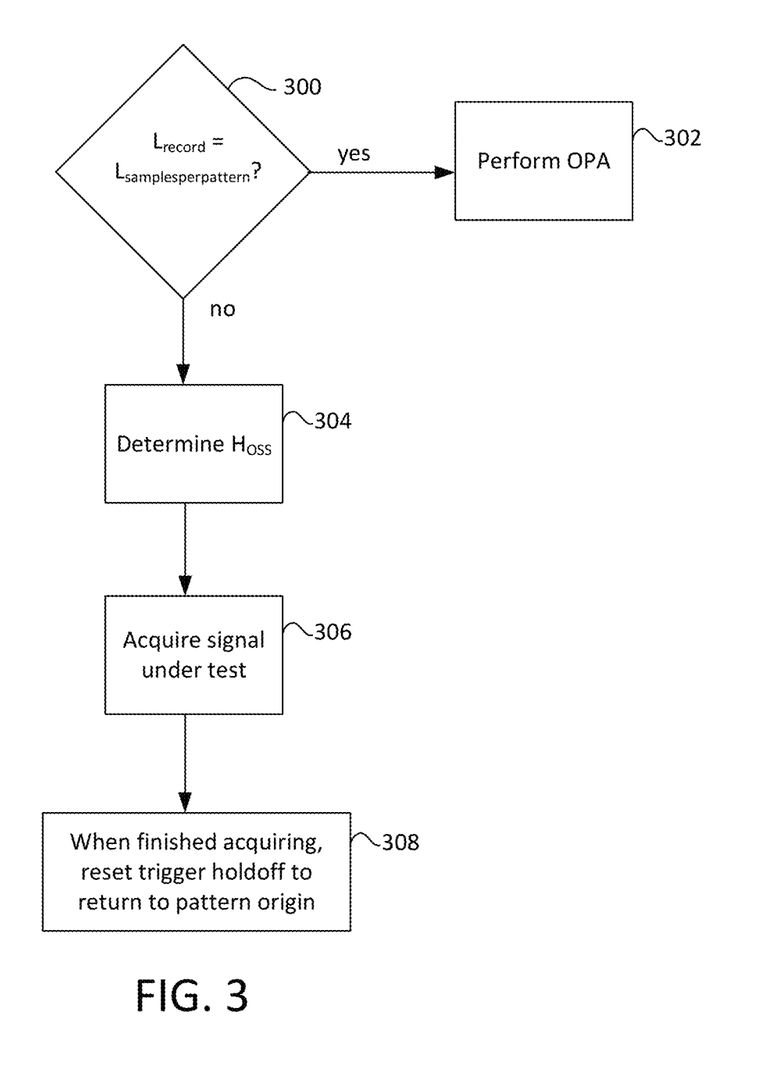
FIG. 3 is a flow chart for performing a partial pattern acquisition of a signal under test according to some embodiments of the disclosure.

FIG. 3 illustrates a flow chart for performing OSS partial pattern acquisition of a signal under test according to some embodiments of the disclosure. Similar to operation 200 in FIG. 2, there may be an operation (not shown) preceding operation 300 in which information is received about the repeating pattern in the signal under test, as mentioned above. In operation 300, the one or more processors 116 determine if the record length, $L_{record}$, is equal to the samples per pattern, $L_{samplesperpattern}$. If yes, in operation 302, OPA is performed as discussed above and shown in FIG. 2, since the acquisition is a full pattern acquisition. $L_{samplesperpattern}$ is an integer product of pattern length and samples per symbol. The record length is the number of samples acquired per pattern in this branch of the flowchart.

If the record length, $L_{record}$, does not equal the samples per pattern, $L_{samplesperpattern}$, then OSS is performed. In operation 304, OSS trigger holdoff, $H_{OSS}$, is determined. This can be done by letting patternPeriod=$L_{pattern}$*(1/$f_{symbol}$) and letting sampleSpacing=samplesPerSymbol*(1$f_{symbol}$).

Then, the one or more processors 116 set the OSS trigger holdoff, $H_{OSS}$, to be a minimum integer multiple of the patternPeriod that is greater than or equal to the minimum trigger holdoff, H. If H is less than or equal to the patternPeriod, then the OSS trigger holdoff is set to the sum of sampleSpacing plus the patternPeriod. However, if the minimum trigger holdoff H is greater than patternPeriod, then the OSS trigger holdoff is set using the following equation (3):

$$H_{OSS} = \text{sampleSpacing} + \text{ceil}(H/\text{patternPeriod})*\text{patternPeriod} \quad (3)$$

Then, in operation 306, a strobe, or trigger, is fired every $H_{OSS}$ period. This, in relation to a previous sample position in the pattern, is always a sample spacing ahead. The one or more processors 116 count the number of strobes, which is identified as $n_{strobe}$. When a record is done acquiring, in operation 308, the one or more processors 116 temporarily change the trigger holdoff to return to the origin of the pattern. That is, if $n_{strobe}$ is greater than or equal to $L_{record}$, then:

$$H_{OSS} = \text{sampleSpacing} * (L_{samplesPerPattern} - L_{record}) \qquad (3)$$

This holdoff value is then restored on the next strobe cycle. This allows for the reset of the pattern so that another partial pattern acquisition can be acquired at the next origin of the pattern.

Figure 4:
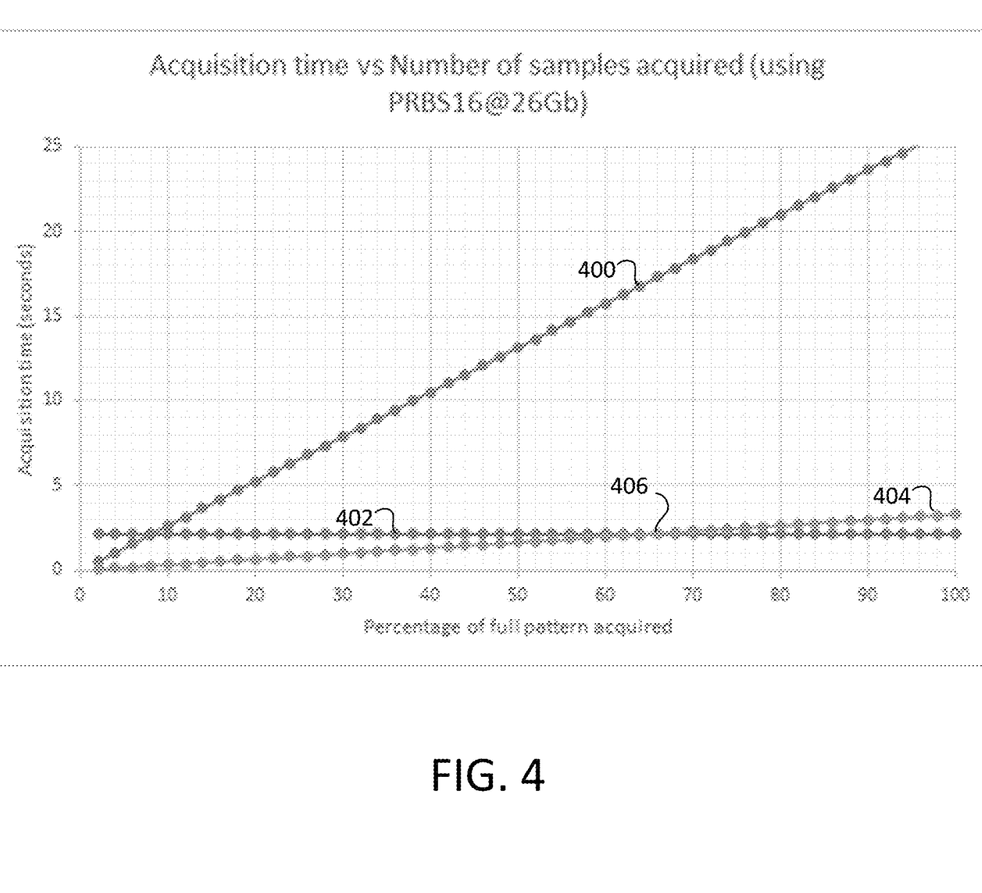
FIG. 4 is a graph illustrating an acquisition time for a traditional oscilloscope, a full pattern acquisition according to some embodiments of the disclosure, and a partial pattern acquisition according to some embodiments of the disclosure.

FIG. 4 illustrates a graph showing the acquisition time for a repeating pattern using a traditional oscilloscope 400, full pattern acquisition OPA 402, discussed above with respect to FIG. 2, and partial pattern acquisition OSS 404, discussed above with respect to FIG. 3. As can be seen in the graph, both the full pattern acquisition OPA 402 and the partial pattern acquisition OSS 404 are quicker than the traditional oscilloscope 400.

For the example of the 26 GHz PRBS16 pattern used throughout this disclosure, the performance of the partial pattern acquisition OSS 404 overtakes the performance of the full pattern acquisition OPA 402 when size of the acquisition is less than 65% of the full pattern acquisition. The performance crossover point 406 depends on a record length, pattern length, and symbol period as follows:

patternPeriod=$L_{pattern}/f_{symbol}$;

if (patternPeriod>$H_{min}$)

Tnew=patternPeriod

Else

Tnew=patternPeriod*ceil($H_{min}$/patternPeriod);

if ($L_{record}$<(($H_{min}$/Tnew)*samplesPerPattern)) OSS is faster.

This may be used by the one or more processors 116 as an alternative to operation 300 of FIG. 3 to determine whether to proceed with full pattern acquisition OPA or partial pattern acquisition OSS.

Figure 5:
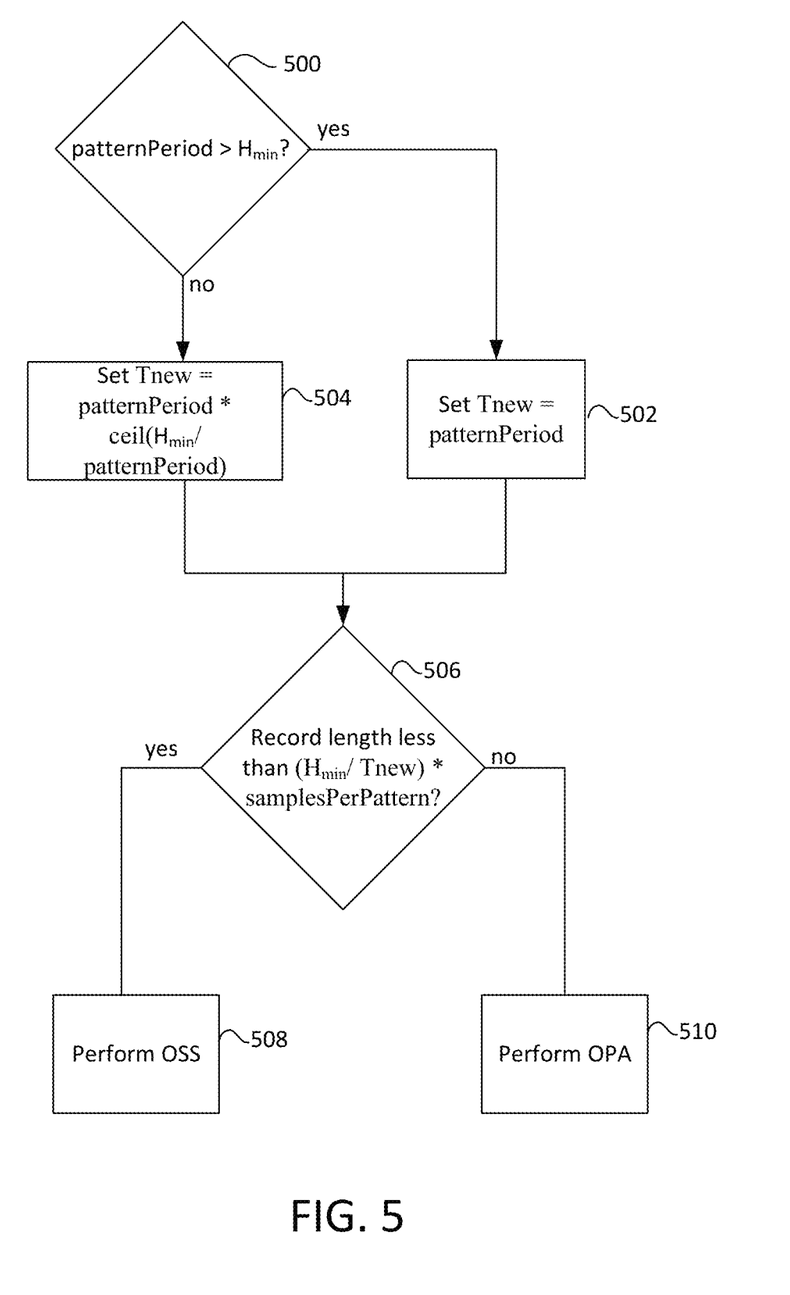
FIG. 5 is a flow chart for determining whether to perform full pattern acquisition or partial pattern acquisition of a signal under test according to other embodiments of the disclosure.

For example, operation 300 in FIG. 3 may be replaced with the method shown in FIG. 5. Initially, in operation 500, it is determined whether the patternPeriod, defined above, is greater than the minimum holdoff period.

If yes, then in operation 502 Tnew is set to be equal to the patternPeriod. Otherwise, in operation 504, Tnew is set equal to patternPeriod*ceil($H_{min}$/patternPeriod).

Once Tnew has been set in either operation 502 or operation 504, it is determined in operation 506 if the record length, $L_{record}$ is less than the value of the minimum holdoff divided by Tnew and then further multiplied by the samplesPerPattern as mentioned above.

If the record length is less than this value, then in operation 508, OSS is performed, i.e. operations 304-308 of FIG. 3, as it will be quicker for acquiring the signal under test. However, if the record length is more than this value, then in operation 510, OPA is performed, i.e. operations 202-216 of FIG. 2, as it will be the quicker method for acquiring the signal under test.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples

Illustrative examples of the technologies disclosed herein are provided below. An embodiment of the technologies may include any one or more, and any combination of, the examples described below.

Example 1 is an equivalent-time sampling test and measurement instrument, comprising a first input configured to receive information about a signal under test that includes a repeating pattern; a second input configured to receive the signal under test; a processor configured to determine an optimized trigger holdoff period based on a minimum trigger holdoff period of the test and measurement instrument; and an acquisition unit configured to acquire a portion of the signal under test every optimized trigger holdoff period.

Example 2 is the equivalent-time sampling test and measurement instrument of example 1, wherein the processor is further configured to determine whether to perform a full pattern acquisition of the signal under test or a partial pattern acquisition of the signal under test.

Example 3 is the equivalent-time sampling test and measurement instrument of either one of examples 1 and 2, wherein the processor is further configured to determine the optimized trigger holdoff period by multiplying a time between samples by a smallest integer value that results in the optimized trigger holdoff period being greater than or equal to the minimum trigger holdoff period.

Example 4 is the equivalent-time sampling test and measurement instrument of any one of examples 1-3, wherein the processor is further configured to: determine a pattern period based on a symbol rate and a pattern length; determine a sample spacing based on a number of samples per symbol and the symbol rate; and determine the optimized trigger holdoff period based on the pattern period and the sample spacing.

Example 5 is the equivalent-time sampling test and measurement instrument of example 4, wherein when the minimum trigger holdoff period is less than or equal to the pattern period, the processor is further configured to determine the optimized trigger holdoff period by adding the sample spacing and the pattern period.

Example 6 is the equivalent-time sampling test and measurement instrument of either one of examples 4 or 5, wherein when the minimum trigger holdoff period is greater than the pattern period, the processor is further configured to determine the optimized trigger holdoff period by the following equation: optimized trigger holdoff period=Sample Spacing+ceil($H_{min}$/Pattern Period)*(Pattern Period).

Example 7 is the equivalent-time sampling test and measurement instrument of any one of examples 1-6, wherein the processor is further configured to determine an index of a number of samples of the signal under test to be acquired and to bump an index of an acquisition when a sample corresponding to the index has already been acquired.

Example 8 is a method for acquiring a signal under test that includes a repeating pattern, comprising: receiving information about the signal under test; generating an optimized trigger holdoff period based on a minimum trigger holdoff period of a test and measurement instrument; and acquiring a waveform representing at least a portion of the signal under test by sampling a portion of the signal under test every optimized trigger holdoff period.

Example 9 is the method of example 8, further comprising determining whether to perform a full pattern acquisition of the signal under test or a partial pattern acquisition of the signal under test.

Example 10 is the method of either one of examples 8 or 9, further comprising generating the optimized trigger holdoff period by multiplying a time between samples by a smallest integer value that results in the optimized trigger holdoff period being greater than or equal to the minimum trigger holdoff period.

Example 11 is the method of any one of examples 8-10, further comprising: determining a pattern period based on a symbol rate and a pattern length; determining a sample spacing based on a number of samples per symbol and the symbol rate; and generating the optimized trigger holdoff period based on the pattern period and the sample spacing.

Example 12 is the method of example 11, wherein when the minimum trigger holdoff period is less than or equal to the pattern period, the method further comprising generating the optimized trigger holdoff period by adding the sample spacing and the pattern period.

Example 13 is the method of either one of examples 11 or 12, wherein when the minimum trigger holdoff period is greater than the pattern period, the method further comprising generating the optimized trigger holdoff period by the following equation:

$$\text{optimized trigger holdoff period} = \text{Sample Spacing} + \text{ceil}(H_{min}/\text{Pattern Period})*(\text{Pattern Period}).$$

Example 14 is the method of any one of examples 8-13, further comprising determining an index of a number of samples of the signal under test to be acquired and bumping an index of an acquisition when a sample corresponding to the index has already been acquired.

Example 15 is one or more non-transitory computer-readable storage media comprising instructions, which, when executed by one or more processors of a test and measurement instrument, cause the test and measurement instrument to: receive information about a repeating pattern in a signal under test, and acquisition information including a number of samples per pattern to acquire and a record length; determine whether to acquire a full pattern acquisition or a partial pattern acquisition based on the number of samples per pattern to acquire and the record length; generate an optimized trigger holdoff period based on a minimum trigger holdoff period of the test and measurement instrument and whether the acquisition is the full pattern acquisition or the partial pattern acquisition; and acquire the signal under test by acquiring a portion of the signal under test every optimized trigger holdoff period.

Example 16 is the one or more non-transitory computer-readable storage media of example 15, wherein the instructions further cause the test and measurement instrument to generate the optimized trigger holdoff period by multiplying a time between samples by a smallest integer value that results in the optimized trigger holdoff period being greater than or equal to the minimum trigger holdoff period.

Example 17 is the one or more non-transitory computer-readable storage media of either one of examples 15 or 16, wherein the instructions further cause the test and measurement instrument to: determine a pattern period based on a symbol rate and a pattern length; determine a sample spacing based on a number of samples per symbol and the symbol rate; and generate the optimized trigger holdoff period based on the pattern period and the sample spacing.

Example 18 is the one or more non-transitory computer-readable storage media of example 17, wherein when the minimum trigger holdoff period is less than or equal to the pattern period, the instructions further cause the test and measurement instrument to generate the optimized trigger holdoff period by adding the sample spacing and the pattern period.

Example 19 is the one or more non-transitory computer-readable storage media of either one of examples 17 or 18, wherein when the minimum holdoff trigger period is greater than the pattern period, the instructions further cause the test and measurement instrument to generate the optimized trigger holdoff period by the following equation:

$$\text{optimized trigger holdoff period} = \text{Sample Spacing} + \text{ceil}(H_{min}/\text{Pattern Period})*(\text{Pattern Period}).$$

Example 20 is the one or more non-transitory computer-readable storage media of any one of examples 15-19, wherein the instructions further cause the test and measurement instrument to determine an index of a number of samples of the signal under test to be acquired and to bump an index of an acquisition when a sample corresponding to the index has already been acquired.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. An equivalent-time sampling test and measurement instrument, comprising:
   a first input configured to receive information about a signal under test that includes a repeating pattern;
   a second input configured to receive the signal under test;
   a processor configured to:
      determine a pattern period based on the received information including a symbol rate and a pattern length;
      determine a sample spacing relative to a number of samples per symbol and the symbol rate;
      determine an optimized trigger holdoff period based on the pattern period and the sample spacing;
      generate the optimized trigger holdoff period relative to a minimum trigger holdoff period of the test and measurement instrument; and
      acquire a portion of the signal under test every optimized trigger holdoff period.

2. The equivalent-time sampling test and measurement instrument of claim 1, wherein when the minimum trigger holdoff period is less than or equal to the pattern period, the processor is further configured to determine the optimized trigger holdoff period by adding the sample spacing and the pattern period.

3. The equivalent-time sampling test and measurement instrument of claim 1, wherein when the minimum trigger holdoff period, $H_{min}$, is greater than the pattern period, the processors is further configured to determine the optimized trigger holdoff period by the following equation:

optimized trigger holdoff period=Sample Spacing+ ceil($H_{min}$/Pattern Period)*(Pattern Period)),
   where ceil( ) is the mathematical ceiling function.

4. A method for acquiring a signal under test that includes a repeating pattern, comprising:
   receiving information about the signal under test;
   determining a pattern period based on the received information including a symbol rate and a pattern length;
   determining a sample spacing based on a number of samples per symbol and the symbol rate;
   generating an optimized trigger holdoff period relative to the pattern period and the sample spacing; and
   acquiring a waveform representing at least a portion of the signal under test by sampling a portion of the signal under test every optimized trigger holdoff period.

5. The method of claim 4, wherein when the minimum trigger holdoff period is less than or equal to the pattern period, the method further comprising generating the optimized trigger holdoff period by adding the sample spacing and the pattern period.

6. The method of claim 4, wherein when the minimum trigger holdoff period is greater than the pattern period, the method further comprising generating the optimized trigger holdoff period, $H_{min}$, by the following equation:

optimized trigger holdoff period=Sample Spacing+ ceil($H_{min}$/Pattern Period)*(Pattern Period)),
   where ceil( ) is the mathematical ceiling function.

7. One or more non-transitory computer-readable storage media comprising instructions, which, when executed by one or more processors of a test and measurement instrument, cause the test and measurement instrument to:
   receive information about a repeating pattern in a signal under test, and acquisition information including a pattern length and a record length;
   determine whether to acquire a full pattern acquisition or a partial pattern acquisition based on a number of samples per pattern and the record length;
   generate an optimized trigger holdoff period based on a minimum trigger holdoff period of the test and measurement instrument and whether the acquisition is the full pattern acquisition or the partial pattern acquisition; and
   acquire the signal under test by acquiring a portion of the signal under test every optimized trigger holdoff period.

8. The one or more non-transitory computer-readable storage media of claim 7, wherein the instructions further cause the test and measurement instrument to generate the optimized trigger holdoff period by multiplying a time between samples by a smallest integer value that results in the optimized trigger holdoff period being greater than or equal to the minimum trigger holdoff period.

9. The one or more non-transitory computer-readable storage media of claim 7, wherein the instructions further cause the test and measurement instrument to:
   determine a pattern period based on a symbol rate and a pattern length;
   determine a sample spacing based on a number of samples per symbol and the symbol rate; and
   generate the optimized trigger holdoff period based on the pattern period and the sample spacing.

10. The one or more non-transitory computer-readable storage media of claim 9, wherein when the minimum trigger holdoff period is less than or equal to the pattern period, the instructions further cause the test and measurement instrument to generate the optimized trigger holdoff period by adding the sample spacing and the pattern period.

11. The one or more non-transitory computer-readable storage media of claim 9, wherein when the minimum trigger holdoff period, $H_{min}$, is greater than the pattern period, the instructions further cause the test and measurement instrument to generate the optimized trigger holdoff period by the following equation:

optimized trigger holdoff period=Sample Spacing+ceil($H_{min}$/Pattern Period)*(Pattern Period), where ceil( ) is the mathematical ceiling function.

12. The one or more non-transitory computer-readable storage media of claim 7, wherein the instructions further cause the test and measurement instrument to determine an index of a number of samples of the signal under test to be acquired and to bump an index of an acquisition when a sample corresponding to the index has already been acquired.

* * * * *